United States Patent [19]
Kano

[11] Patent Number: 5,221,857
[45] Date of Patent: Jun. 22, 1993

[54] BIPOLAR TRANSISTOR STRUCTURE WITH POLYCRYSTALLINE RESISTOR LAYER

[75] Inventor: Isao Kano, Tokyo, Japan

[73] Assignee: NEC Corporation, Tokyo, Japan

[21] Appl. No.: 808,110

[22] Filed: Dec. 16, 1991

[30] Foreign Application Priority Data

Dec. 19, 1990 [JP] Japan .................................. 2-403484

[51] Int. Cl.[5] ...................... H01L 29/72; H01L 27/12; H01L 27/02; H01L 29/04
[52] U.S. Cl. .................................... 257/539; 257/538; 257/536; 257/510; 257/516
[58] Field of Search ........................ 357/34, 35, 49, 51, 357/54, 59 F; 257/539, 538, 536, 510, 516

[56] References Cited

U.S. PATENT DOCUMENTS

| | | | |
|---|---|---|---|
| 5,043,786 | 8/1991 | Desilets et al. | 357/35 |
| 5,109,262 | 4/1992 | Kadota et al. | 357/34 |
| 5,117,273 | 5/1992 | Stark et al. | 357/54 |

Primary Examiner—Rolf Hille
Assistant Examiner—Wael Fahmy
Attorney, Agent, or Firm—Laff, Whitesel Conte & Saret

[57] ABSTRACT

A polycrystalline silicon layer 9 for a base leading electrode is formed on an element forming region divided by an element isolating layer which is formed by burying a BPSG film 8 in a groove. A depression generated on the element isolating layer is filled with a PSG film 11 which is formed as a part of an interlayer insulating film on the surface of the device including the polycrystalline silicon layer 9 by the spin-coating method so that the upper surface of the device is flattened. A polycrystalline silicon layer 13 is provided on the element isolating layer as a resistor layer so that the resistor layer is disposed between the adjacent transistors. The area of a circuit block is reduced to achieve a high integration and reduction in parasitic capacitance. This enables the high speed operation.

9 Claims, 11 Drawing Sheets

BIPOLAR TRANSISTOR STRUCTURE WITH POLYCRYSTALLINE RESISTOR LAYER

BACKGROUND OF THE INVENTION

1. Field of the Invention

The present invention relates to a semiconductor device and a process for manufacturing the same and in particular to a semiconductor device having a polycrystalline silicon (or polysilicon) resistor layer and bipolar transistors and a process for manufacturing the same.

2. Description of the Prior Art

The emitter coupled logic (ECL) circuit comprises NPN type bipolar transistor elements and resistor elements as basic structural elements. A circuit diagram of the simplest invertor circuit is exemplarily shown in FIG. 1. The invertor circuit comprises a total of four transistor elements, $Q_1$, $Q_2$, $Q_3$ and $Q_4$ and a total of four resistor elements, $R_1$, $S_2$, $R_3$ and $R_4$.

FIGS. 2 through 5 are sectional views of a semiconductor chip sequentially showing a process for manufacturing a prior art semiconductor device in the order of steps.

As shown in FIG. 2, an N+ type buried layer 2 and an N− type epitaxial layer 3 are formed on a P type silicon substrate 1 and element isolating grooves are provided and element isolating layers 31 are buried in the groove to divide element forming regions and a silicon oxide film 6 is formed over the entire surface of the device. The element isolating layers 31 are formed as follows: A silica film (hereinafter referred to as a BPSG film) containing boron and phosphorus (Boro-Phospho-Silicate Glass) is deposited on the surface of the device including the grooves by the low-pressure or evacuated CVD method or the like. Thereafter, the BPSG film is buried in only the grooves by etching back the BPSG film. Accordingly, a more or less depression may be formed in each of the grooves due to variation in the etch back.

Then, as shown in FIG. 3, a polycrystalline silicon layer is deposited over an entire surface of the device and boron is ion implanted into the polycrystalline silicon layer. The polycrystalline silicon layer is patterned to form a base leading electrode 9a and a resistor layer 9b.

Then, as shown in FIG. 4, a silicon nitride film 10 is deposited over the entire surface of the device. The silicon nitride film 10 and the base leading electrodes 9a are selectively and sequentially removed by etching to form openings. Undercut portions 15 are formed under the base leading electrode 9a by etching the silicon oxide film 6 using the silicon nitride film 10 as a mask.

A thin polycrystalline silicon layer 16 (FIG. 5) is deposited over the entire surface of the device to fill the undercut portions 15 (FIG. 4) as shown in. The deposited thin polycrystalline silicon layer 16 is converted into a silicon oxide film by the thermal oxidation except for the layer filling the undercut portions 15. The polycrystalline silicon layer 16 is buried in only the undercut portions 15 by etching the silicon oxide film. The impurity contained in the base leading electrode 9a is introduced into the silicon substrate 1 via the polycrystalline silicon layer 16 to form a graft base region 17. Subsequently, a base region 18 is formed by ion implanting boron into the silicon substrate 1 in the opening. A silicon nitride film 19 is formed over the entire surface of the device and is etched back to leave the silicon nitride film 19 only on the side of the opening so that a side wall is formed. A polycrystalline silicon layer 20 containing an N type impurity or dopant is deposited on the surface of the device including the opening. An impurity is introduced on the surface of the base region 18 from the polycrystalline silicon layer 20 to form an emitter region 21. The semiconductor device is thus completed by providing the silicon nitride film 10 on the resistor layer 9b with contact holes.

Since, in the prior semiconductor device as mentioned above, the base leading electrodes and the resistor layers are provided in the same layer by patterning the same polycrystalline silicon layer, they cannot be provided in the vicinity of transistors and are disposed in positions remote from the transistor region. Accordingly, such prior semiconductor device has a problem that wirings become long to prevent the circuits from being integrated, resulting in that an improvement in circuit characteristics is difficult.

If base leading electrodes and resistor layers are tried to be formed of the same layer between transistors which are disposed at the minimum occupation area in each of element forming regions which are isolated by element isolating layers, the spacing between the adjacent transistors is about double as wide as the minimum line width in consideration of the margin for an emitter contact and a base leading electrode even when the emitter size is reduced to about the minimum line width. Therefore, the base leading electrodes and the resistor layers cannot be disposed in the same layer between the transistors.

Even if the resistor layers can be disposed between the transistors by increasing the spacing between the transistors, the resistor layers would traverse across the element isolating layers thereabove. The resistor layers would be influenced by steps of the element isolating layer which are caused by etch back or the like. The variations in the value of resistance would become larger. The variations in resistance value in usual ECL circuit is undesirable since it should be suppressed within several % in terms of relative value.

SUMMARY OF THE INVENTION

A semiconductor device of the present invention comprises one conductivity type semiconductor substrate; an opposite conductivity type buried layer formed on said substrate; an opposite conductivity type epitaxial layer formed on the surface of the device including said buried layer; a groove which penetrates through said epitaxial layer and the buried layer to reach said semiconductor substrate; an element isolating layer which is buried in said groove to divide and isolate element forming region; a bipolar transistor formed on said element forming region; a base leading electrode formed on said element forming region; an interlayer insulating film which is formed on the surface of the device including said base leading electrode to fill a depression on said element isolating layer for flattening the upper surface of the device; and a resistor layer formed on the interlayer insulating film on said element insulating layer.

A process for manufacturing a semiconductor device of the present invention comprises the steps of selectively forming on one conductivity type semiconductor substrate an opposite conductivity type buried layer to form an opposite conductivity type epitaxial layer on the surface of the device including said buried layer; forming a groove which reaches said semiconductor substrate by selectively and sequentially etching said epitaxial layer and buried layer; forming an element isolating layer which insulates and isolates an element forming region by forming a first insulating film on the surface of the device including said groove, depositing a second thick insulating film on said first insulating film to fill said groove with said second insulating film, and thereafter leaving said second insulating film buried in said groove by etching back the second insulating film; forming a base leading electrode by selectively forming a polycrystalline silicon layer doped with one conductivity type impurity on said element forming region; forming an interlayer insulating film having an flattened upper surface by filling a depression caused on said element isolating layer by the spin-coating method on the surface of the device including said base leading electrode; forming a resistor layer by selectively forming a doped polycrystalline silicon layer on said interlayer insulating film on said element isolating layer; forming a third insulating film on the surface of the device including said resistor layer; forming an opening by selectively and sequentially etching said third insulating film, said interlayer insulating film, said base leading electrode and said first insulating film on said element forming region; and forming in the epitaxial layer in sid opening one conductivity type base region which is connected with said base leading electrode and forming an opposite conductivity type emitter region in said base region.

DETAILED DESCRIPTION OF THE PREFERRED EMBODIMENT

The present invention will now be described with reference to the drawings.

FIGS. 6 to 11 are sectional views of a semiconductor chip showing a process for manufacturing the semiconductor chip in the order of the steps.

Figure 1:
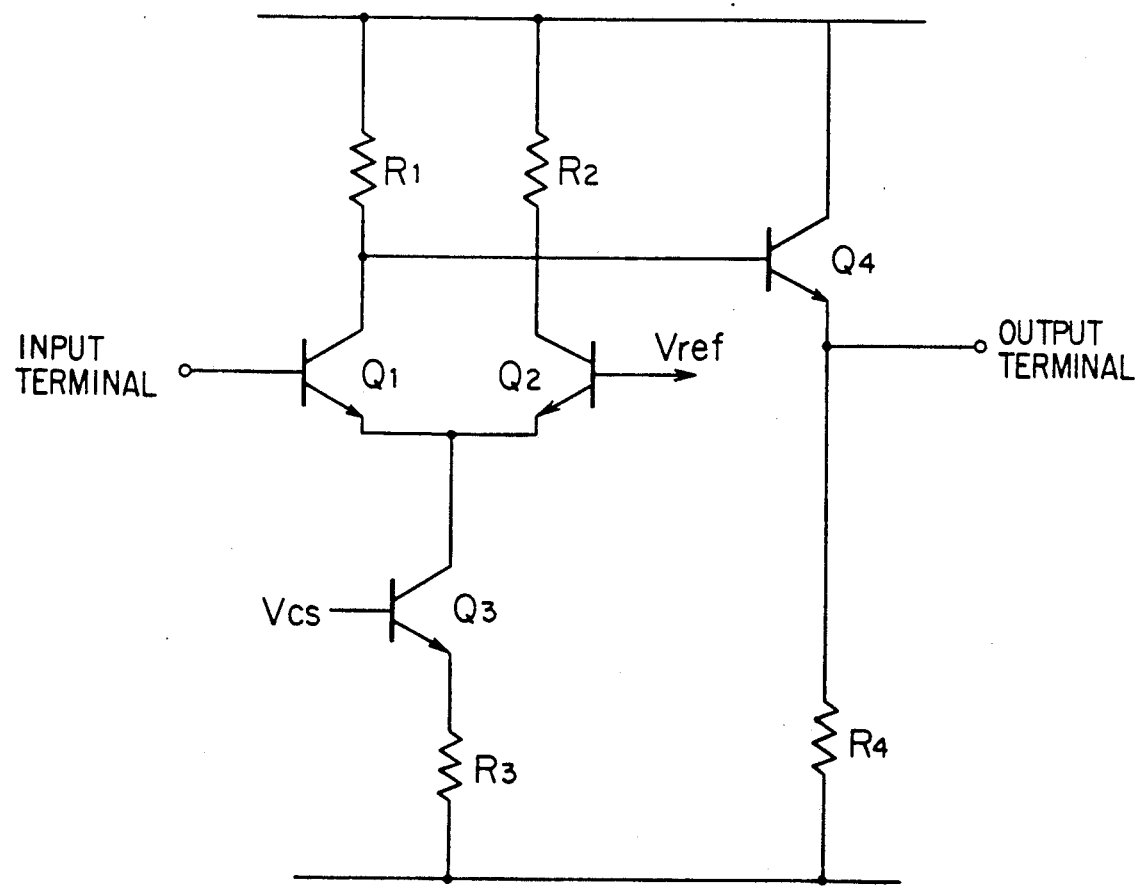
FIG. 1 is a circuit diagram showing an example of an ECL circuit.
Figure 2:
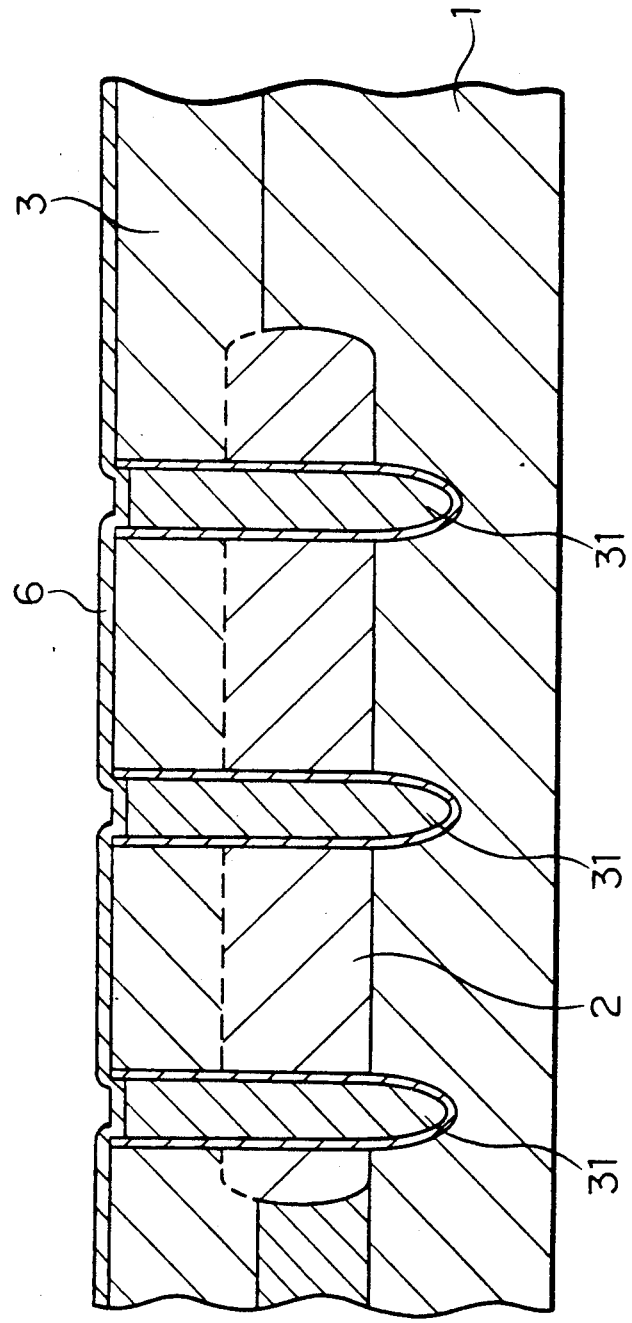
FIGS. 2 through 5 are sectional views of a semiconductor chip sequentially showing a process for manufacturing a prior art semiconductor device in the order of the steps.
Figure 3:
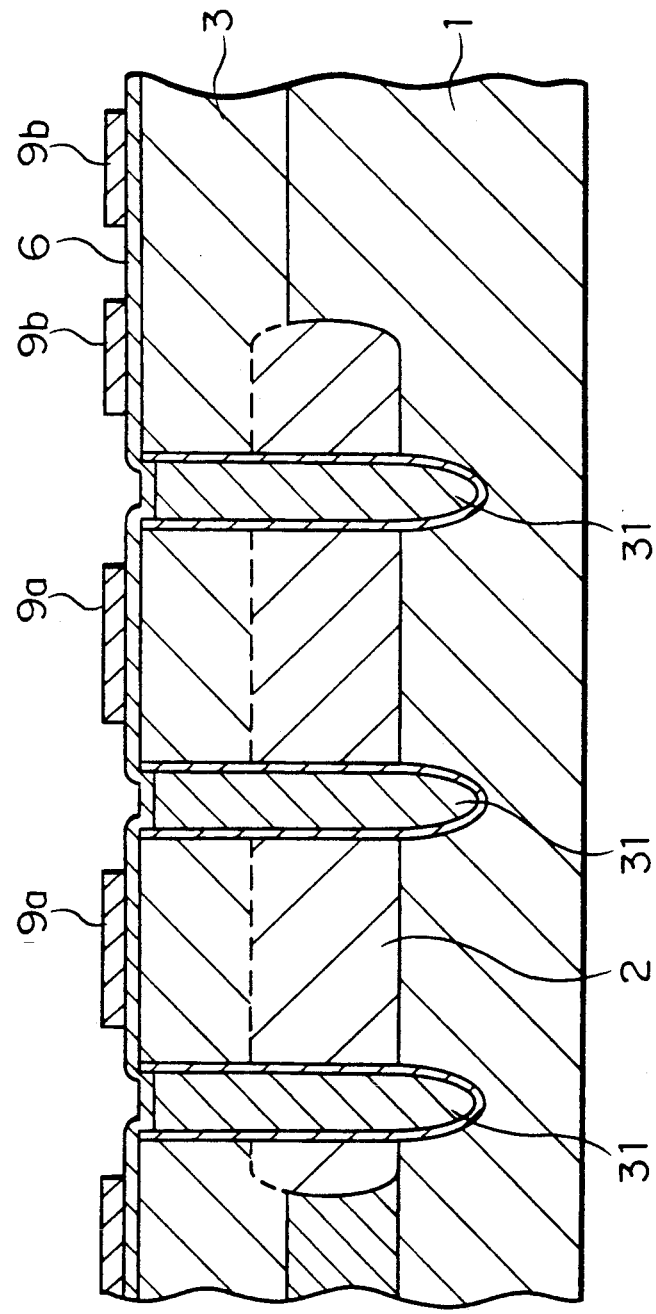
Figure 4:
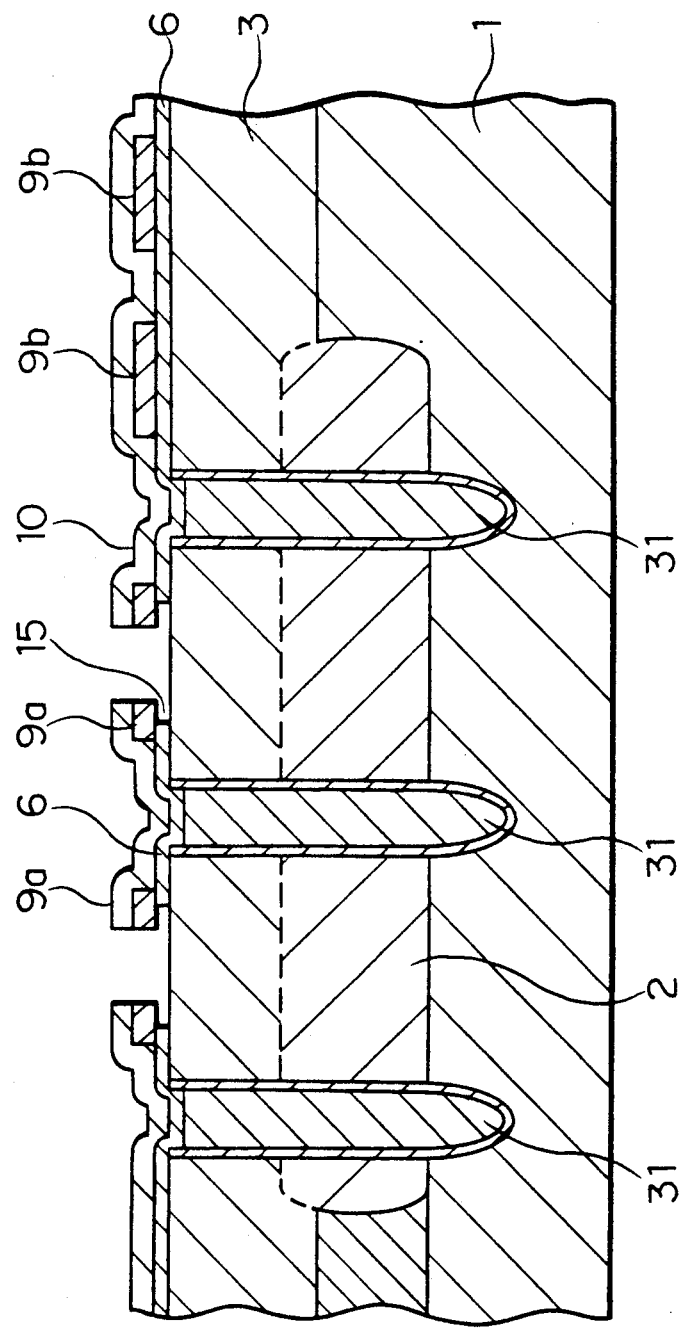
Figure 5:
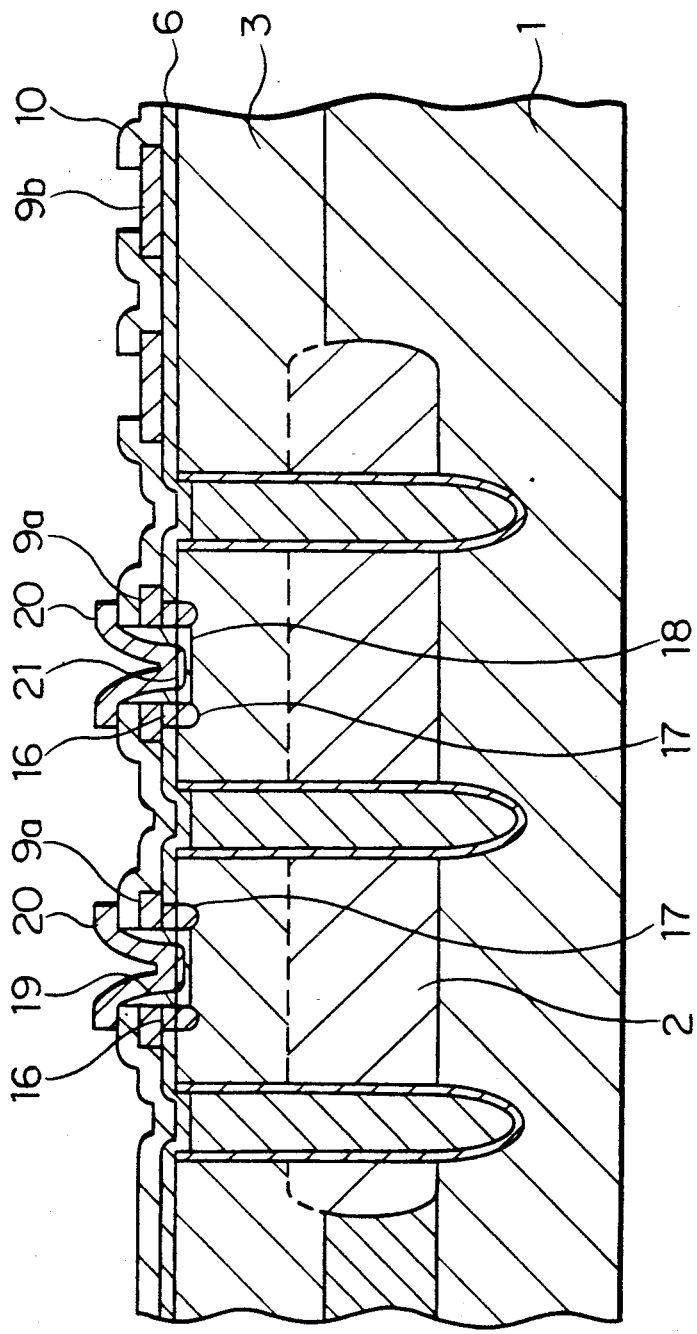
Figure 6:
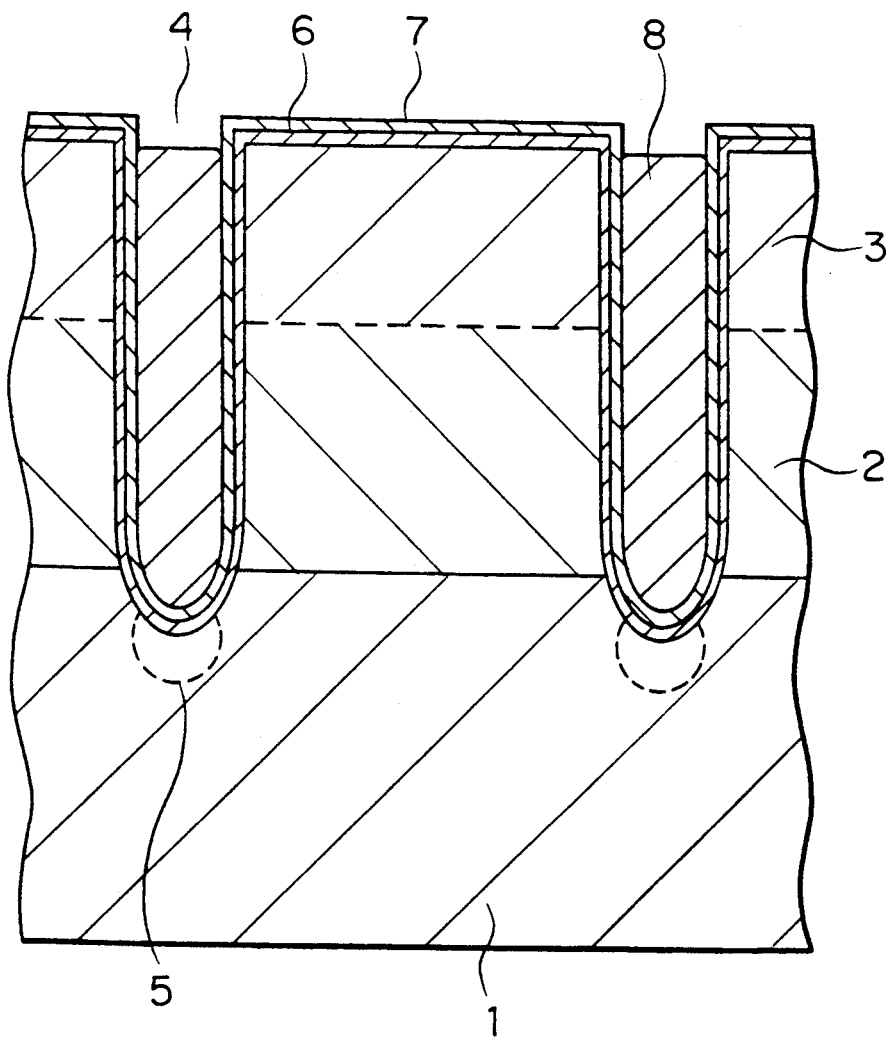
FIGs. 6 through 11 are sectional views of a semiconductor chip sequentially showing a process for manufacturing the semiconductor chip in accordance with one embodiment of the present invention in the order of the steps thereof.

An $N^+$ type buried layer 2 is selectively formed on a main surface of a P type silicon substrate 1 as shown in FIG. 6. An $N^-$ type epitaxial layer 3 is then deposited on the surface of the substrate including the surface of the buried layer 2. In the epitaxial layer 3 and the buried layer 2, element isolating grooves 4 are formed and reach the silicon substrate 1 to divide element forming regions. The depths of the grooves 4 are determined in consideration of the depths of the epitaxial layer 3 and the buried layer 2. In this embodiment, the thickness of the epitaxial layer 3 and the buried layer 2 are 1.5 $\mu$m and 2.0 $\mu$m, respectively, whereas the depths of the grooves 4 are about 4.0 $\mu$m. $P^+$ type diffusion layers 5 are formed below the bottoms of the grooves 4 by the ion implantation method. An silicon oxide film 6 and a silicon nitride film 7 are sequentially deposited upon the surface of the device including the surfaces of the grooves 4. BPSG film 8 is formed on the surface of the device and it fills the grooves 4. After reflow of the BPSG film 8, an etching back is performed so that the BPSG film 8 is buried in only the grooves 4 to form element isolating layers for insulating and isolating element forming regions. The etching back is performed by the dry etching and/or wet etching method. At this time, it is necessary to completely remove the BPSG film 8 on the element forming regions. If the BPSG film 8 on the element forming regions is completely removed, a depression may be formed on each of the grooves 4 due to variations in film thickness and etching rate.

Figure 7:
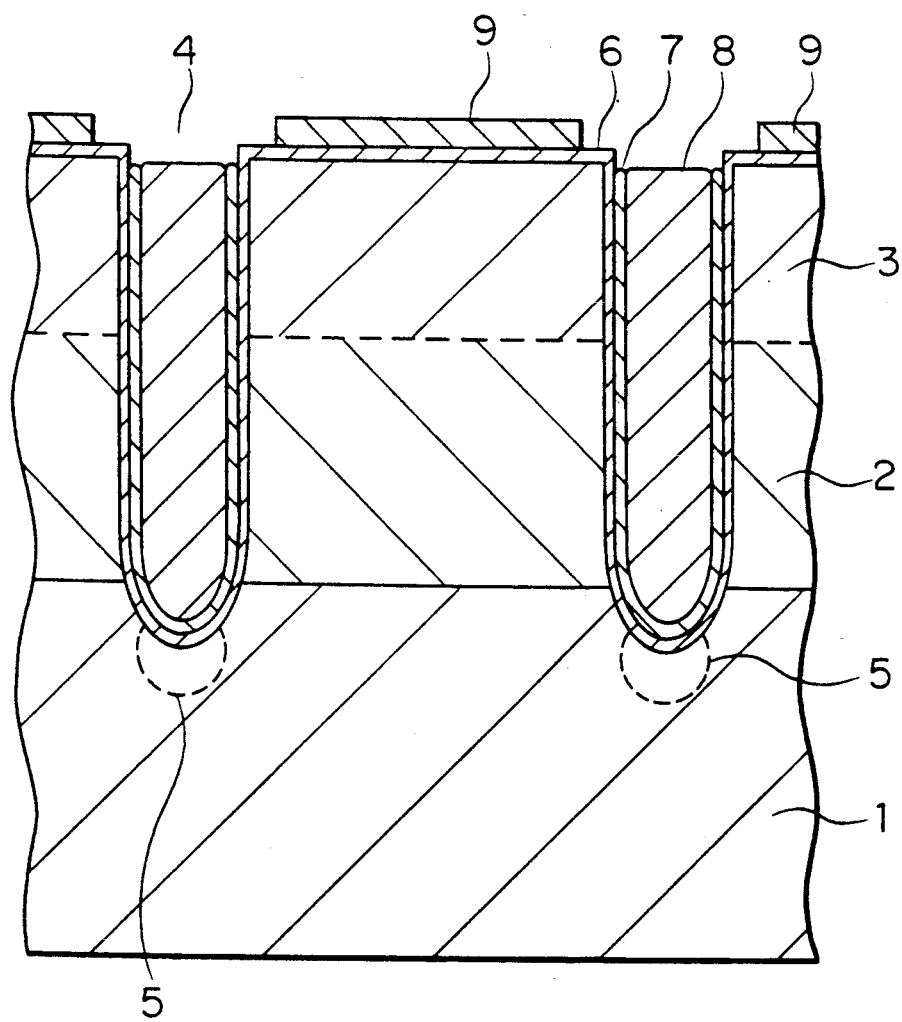

As shown in FIG. 7, after the silicon nitride film 7 on the surface has been removed, a polycrystalline silicon layer 9 which will form the base leading electrodes of bipolar transistor is formed over the entire surface of the device in thickness of 150 to 250 nm and is doped with boron and is then patterned to form base leading electrodes.

Figure 8:
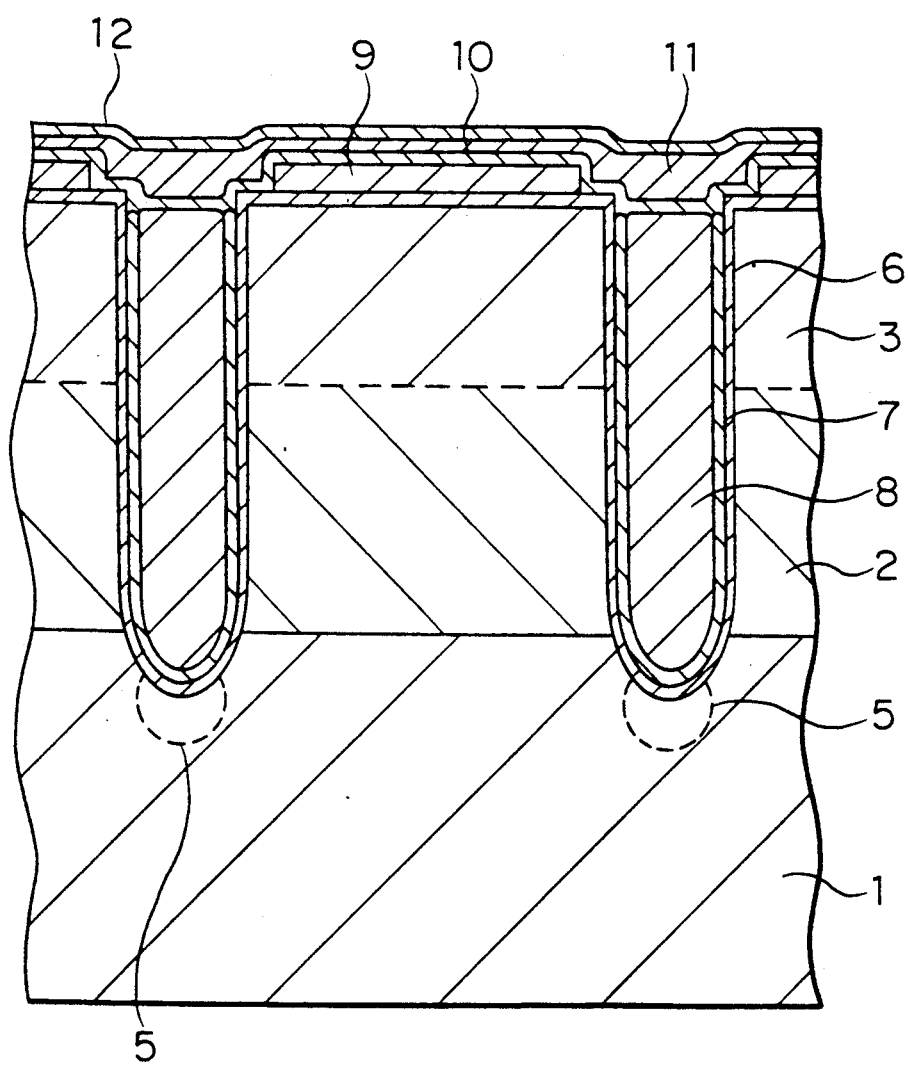

Then, a silicon nitride film 10 having a thickness of 30 to 150 nm is deposited on the surface of the device including the surface of the polycrystalline silicon layer 9 as shown in FIG. 8 by the low-pressure or evacuated CVD method. A solution which contains a silicon compound as a main component is applied upon the silicon nitride film 10 by the spin-coating method and is baked to form a PSG (phospho-silicate glass) film 11 for flattening the upper surface of the device. Then, a silicon nitride film 12 is deposited upon the PSG film 11 in thickness of 30 to 150 nm. The thickness of the PSG film 11 is about 50 nm and about 300 to 500 nm on the polycrystalline silicon layer 9 and the groove 4, respectively. The flatness may be enhanced by slightly etching back the surface of the PSG film 11 so that the uppermost surface of the silicon nitride film 10 is exposed. Alternatively, a PSG film, a BSG film, a BPSG film or the like may be formed by the CVD method in lieu of the PSG film 11 formed by the application method. The films may reflow by a heat-treatment to flatten the upper surface of the device. Passivation and gettering effects can be expected.

Figure 9:
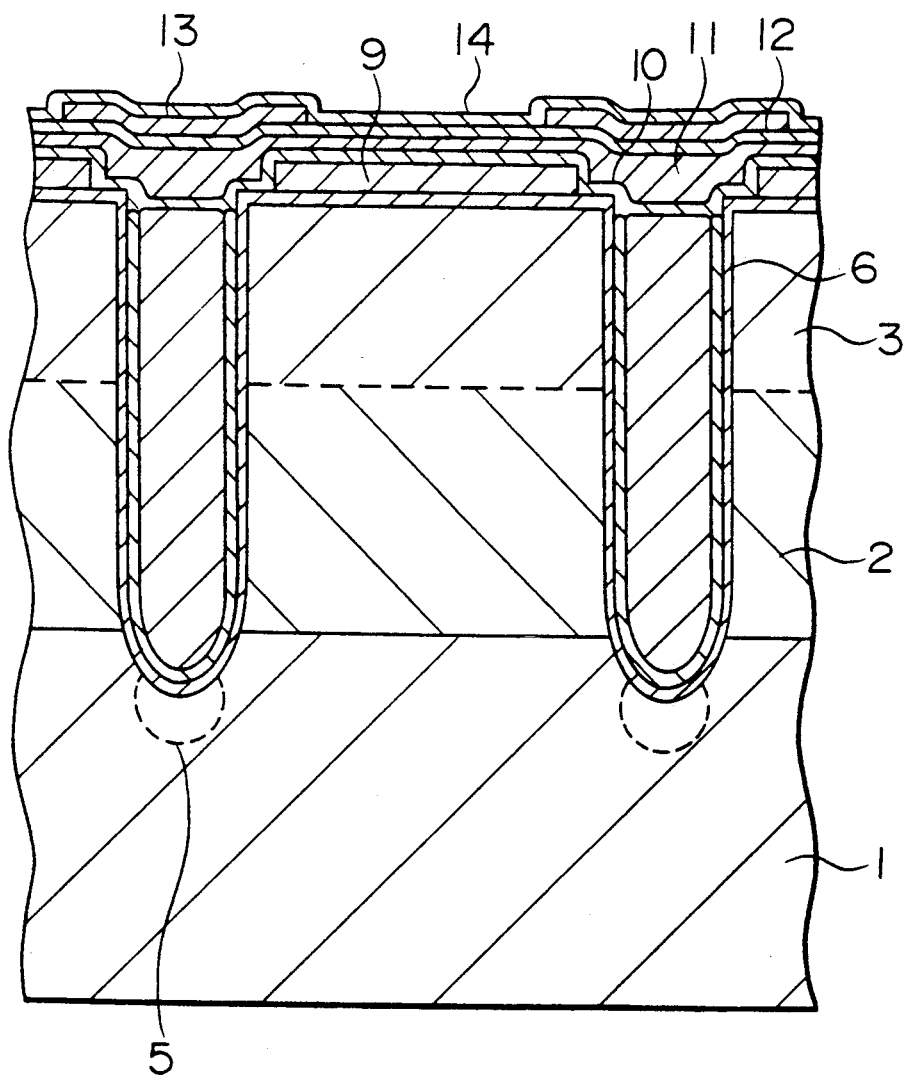

Then, as shown in FIG. 9, a polycrystalline silicon layer 13 is formed over the entire surface of the device in thickness of 80 to 150 nm and is doped with boron and is patterned to form resistor layers of the polycrystalline silicon layers 13 on the grooves 4. Then, a silicon nitride film 14 is deposited upon the surface of the device including the surface of the polycrystalline silicon layer 13 in thickness of 30 to 150 nm.

Figure 10:
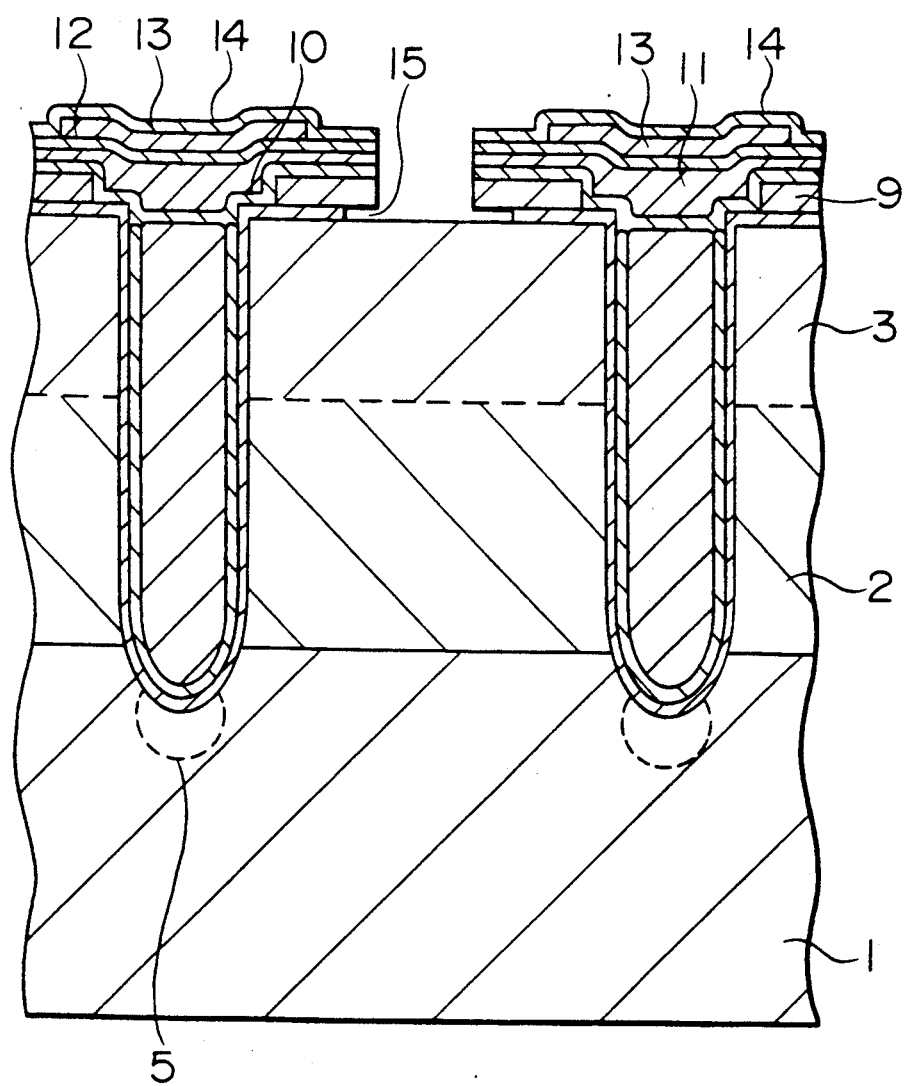

Then, as shown in FIG. 10, the silicon nitride film 14, the silicon nitride film 12, the PSG film 11, the silicon nitride film 10 and the polycrystalline silicon layer 9 on the element forming regions are sequentially and selectively removed by anisotropic etching. Thereafter, the thin silicon oxide film 6 located under the polycrystalline silicon layer 9 is subjected to isotropic wet etching to form undercut portions 15. The width of the graft base is determined by the length of the undercut portion 15 in depth. When the ratio of the height to the depth of the undercut portion 15 is ¼ and more, it becomes difficult to bury a polycrystalline silicon layer in next step. Accordingly, the length of the undercut portion 15 in depth is made not more than four times as thick as that of the silicon oxide film 6.

Figure 11:
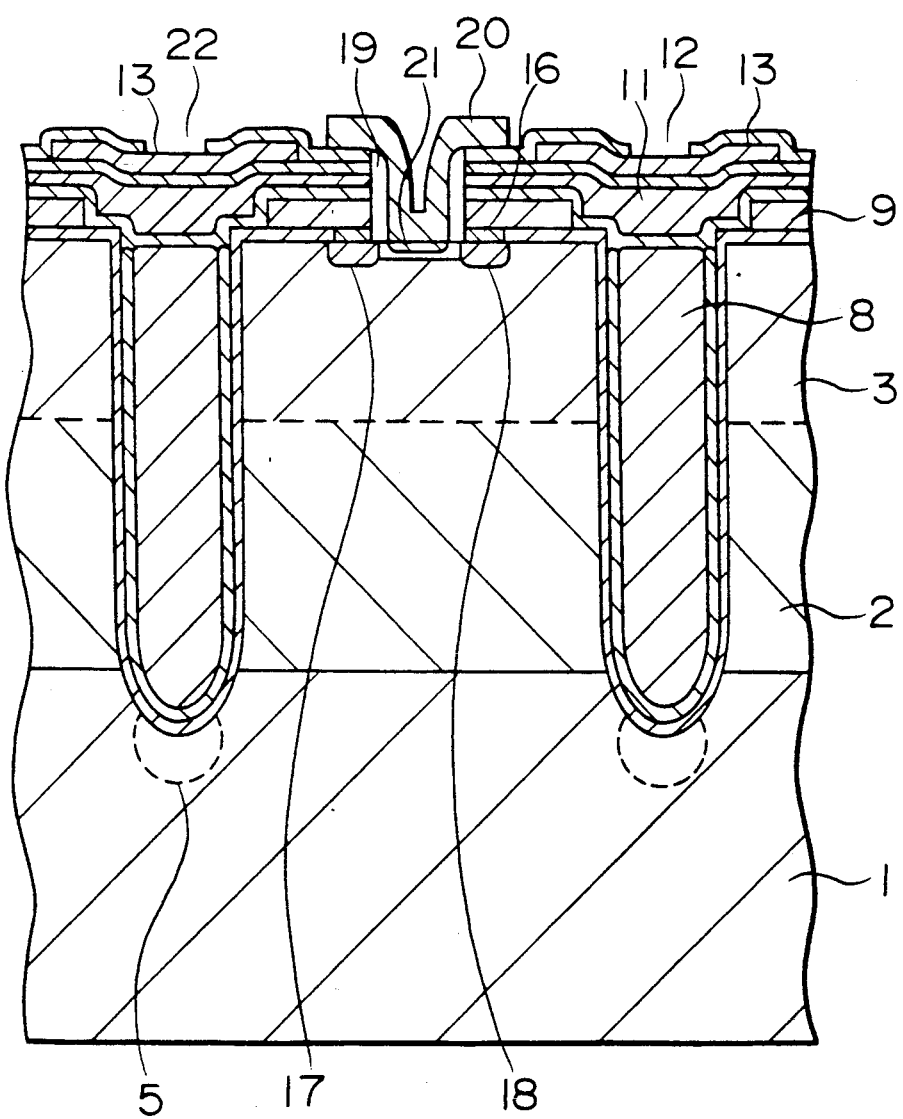

Then, as shown in FIG. 11, a polycrystalline silicon layer 16 is deposited in thickness of 25 to 50 nm on the surface of the device including the surface in the opening to fill the undercut portion 15 with the polycrystalline silicon. Thereafter, the device is thermally oxidized in a steam atmosphere at 850° C. under an atmospheric pressure for 60 minutes so that the polycrystalline silicon layer 16 other than the polycrystalline silicon layer 16 filling the undercut portion 15 is converted into a silicon oxide film by the thermal oxidation. Then, a wet etching is conducted in a 1:6 buffered hydrofluoric acid solution for one minute to remove the silicon oxide layer 9. A graft base region 17 is formed by introducing boron contained in the polycrystalline silicon layer 9 into the silicon substrate 1 via the polycrystalline silicon layer 16 simultaneously with this heat treatment or by another heat treatment. A base region 18 which is connected with the graft base region 17 is formed by ion implanting boron into the silicon nitride films 14, 12 and the silicon substrate 1 in the opening. Then, a silicon nitride film 19 is deposited on the surface of the device including the opening. The deposited silicon nitride film 19 is etched back by the anisotropic etching to leave the silicon nitride film 19 only on the inner side of the opening so that a side wall portion is formed thereon. A polycrystalline silicon layer 20 is deposited upon the surface including the opening. An emitter region 21 is formed by introducing an N type impurity such as arsenic or phosphorus on the surface of the base region 18 via the polycrystalline silicon layer 20. The polycrystalline silicon layer 20 is selectively etched to form an emitter electrode and to provide a contact hole 22 for the polycrystalline silicon layer 13 serving as a resistor layer.

Alternatively, a double layer structure comprising a polycrystalline silicon layer and a refractory metal silicide layer may be used in lieu of the polycrystalline silicon layer 9. This provides an advantage that the resistance of the base leading electrode can be reduced. The refractory metal silicide layer may include a titanium silicide layer, a tungsten silicide layer, a molybdenum silicide layer and the like.

As mentioned above, in accordance with the present invention, base leading electrodes of polycrystalline silicon layers are provided on element forming regions which are divided by element isolating layers. Depressions on the element isolating layers are filled with interlayer insulating film forming on the surface of the device including the base leading electrodes so that the upper surface of the device is flattened. A resistor layer made of polycrystalline silicon layer can be disposed among transistors by providing the resistor layers on the interlayer insulating film on the element isolating layers. This decreases the area of a circuit block to about 50%.

Secondarily, fast operation cannot be only achieved by the reduction of the circuit blocks and wirings therebetween in size, but also remarkable reduction in cost can be achieved due to reduction in chip size.

Furhtermore, provision of resistor layers on the element isolating layers can reduce the parasitic capacitance between the resistor layers and the substrate.

Reduction in the resistance of the base leading electrode can be controlled independently of the resistance value of the resistor layer since the base leading electrode and the resistor layer are formed in different steps.

What is claimed is:

1. A semiconductor device, comprising
one conductivity type semiconductor substrate;
an opposite conductivity type buried layer formed on said substrate;
an opposite conductivity type epitaxial layer formed on the surface of said substrate and said buried layer;
a groove which penetrates through said epitaxial layer and the buried layer to reach said semiconductor substrate;
an element isolating layer which is buried in said groove to divide and isolate an element forming region;
a bipolar transistor formed on said element forming region;
a base leading electrode formed on said element forming region;
an interlayer insulating film formed above said isolated element forming region and said groove to cover said base leading electrode, the surface of said interlayer insulating film being flattened; and
a resistor layer formed on the interlayer insulating film on said element insulating layer.

2. A semiconductor device as set forth in claim 1, wherein said device comprises further a graft base region formed in said epitaxial layer, one conductivity type base region formed in said epitaxial layer and connected with said base leading electrode and said graft base region, and an opposite conductivity type emitter region in said base region.

3. A semiconductor device as set forth in claim 1, wherein said semiconductor substrate is a P type silicon, said buried layer is an N+ type and said epitaxial layer is an N− type.

4. A semiconductor device as set forth in claim 1, wherein said element isolating layer comprises a BPSG film.

5. A semiconductor device as set forth in claim 1, wherein said base leading electrode comprises a polycrystalline silicon layer doped with one conductivity type impurity, or a double layer comprising a polycrystalline silicon layer and a layer of refractory metal silicide such as titanium, tungsten or molybdenum silicide.

6. A semiconductor device as set forth in claim 1, wherein said interlayer insulating film comprises a film selected from a PSG film, BSG film and BPSG film.

7. A semiconductor device as set forth in claim 1, wherein said resistor layer comprises a polycrystalline silicon layer doped with an impurity.

8. A semiconductor device as set forth in claim 5, wherein said impurity is boron.

9. A semiconductor device as set forth in claim 7, wherein said impurity is boron.

* * * * *